United States Patent
Enzinger et al.

(10) Patent No.: US 11,791,742 B2
(45) Date of Patent: Oct. 17, 2023

(54) PROTECTION DEVICE FOR A PULSE INVERTER

(71) Applicant: AUDI AG, Ingolstadt (DE)

(72) Inventors: Tobias Enzinger, Hohenwart GT Freinhausen (DE); Benjamin Söhnle, Ingolstadt (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 17/453,276

(22) Filed: Nov. 2, 2021

(65) Prior Publication Data
US 2022/0141977 A1 May 5, 2022

(30) Foreign Application Priority Data
Nov. 5, 2020 (DE) .......................... 102020129134.5

(51) Int. Cl.
*H02M 7/00* (2006.01)
*H02K 5/22* (2006.01)
*H05K 9/00* (2006.01)

(52) U.S. Cl.
CPC .............. *H02M 7/003* (2013.01); *H02K 5/22* (2013.01); *H02K 2211/00* (2013.01); *H05K 9/0067* (2013.01)

(58) Field of Classification Search
CPC ................................ H02M 7/003; H02K 5/22
See application file for complete search history.

(56) References Cited

U.S. PATENT DOCUMENTS

| | | | |
|---|---|---|---|
| 10,873,247 B2 * | 12/2020 | Fukuda | F04B 39/00 |
| 2011/0189035 A1 * | 8/2011 | Nakagami | F04C 29/047 |
| | | | 62/505 |
| 2013/0058044 A1 | 3/2013 | Watanabe et al. | |
| 2014/0062368 A1 * | 3/2014 | Roessler | B60L 50/51 |
| | | | 363/55 |
| 2014/0377096 A1 | 12/2014 | Yano et al. | |

FOREIGN PATENT DOCUMENTS

| | | |
|---|---|---|
| DE | 11 2017 000 971 T5 | 12/2018 |
| EP | 2 354 550 A2 | 8/2011 |
| JP | 2017-221083 A | 12/2017 |

\* cited by examiner

*Primary Examiner* — Jared Fureman
*Assistant Examiner* — Esayas G Yeshaw
(74) *Attorney, Agent, or Firm* — Seed IP Law Group LLP

(57) ABSTRACT

A protection device for a pulse inverter is provided and is configured to be detachably arranged on an opening of an open housing part of the pulse inverter, wherein the protection device is configured to protect from dirt, mechanical impact and/or electrostatic charging, at least one inner element of the pulse inverter, in particular an electrical system and/or an electronic system, which is arranged in the open housing part. Furthermore, a pulse inverter is provided comprising a housing, as well as an e-machine with a pulse inverter.

14 Claims, 4 Drawing Sheets

PROTECTION DEVICE FOR A PULSE INVERTER

BACKGROUND

Technical Field

Embodiments of the invention relate to a protection device for a pulse inverter. Furthermore, embodiments of the invention relate to a pulse inverter comprising a housing as well as an electric machine (e-machine) with a pulse inverter.

Description of the Related Art

From document EP 2 354 550 A2, an electric compressor with an integrated inverter is known, comprising an inverter box provided on a periphery of a housing, an inverter with a control board housed in the inverter box, and an electric component mounted on a side of the control board.

From DE 11 2017 000 971 T5, an electric compressor for a vehicle is known, having a compressor housing, an inverter circuit, an inverter housing, and a cover that closes an opening of the inverter housing. The electric compressor further has a sealing component disposed between the inverter housing and the cover, to seal between the inverter housing and the cover. The electric compressor further has a conductive component.

An electric rotary machine unit having a stator, a rotor, and a housing is known from JP 2017 221 083 A. The rotary e-machine unit includes an inverter unit connected to an end portion of the rotary e-machine unit and driving the rotary e-machine unit, wherein the inverter unit is mounted on the electronic component and the electronic part.

Both pulse inverters and e-machines are known in the state of the art. It is known that both a pulse inverter and an e-machine are each formed in their own complete metal housing. When attaching the pulse inverter, part of the housing of the pulse inverter is removed in order to affix the pulse inverter to the housing of the e-machine.

It is also known in the prior art to omit the housing portion of the pulse inverter facing the e-machine, such that a partially open component is present, which, after mounting on the e-machine, uses a machine housing of the e-machine, in particular the metal housing, as an existing housing. The installation of pulse inverters with partially open housings saves costs and weight as well as raw materials.

Partially open housings in pulse inverters are, however, very sensitive when being handled, since they are open electronics that are mounted during assembly or disassembly, for example, in the case of a customer (KD-case), in areas that are not intended for this purpose in terms of residual dirt, mechanical impact and electrostatic charge (ESD). If particles fall on an inner element, in particular on the electrics or electronics of a pulse inverter, or if charged hands come too close to the electrics or electronics, there is a risk of component damage.

Alternatively, it is possible to provide open housing parts of a pulse inverter that have a shipping cover. Sooner or later, however, the shipping cover must also be removed for assembly. This too can lead to contamination of the electrics or electronics of the pulse inverter, for example, by contaminants getting onto the electrics or electronics of the pulse inverter.

BRIEF SUMMARY

Some embodiments provide a protection device which facilitates assembly or replacement of components of an e-machine and, in particular, protects electronic components of a pulse inverter from external influences during assembly or disassembly.

Some embodiments include a protection device for a pulse inverter.

In some embodiments, the protection device is configured to be arranged on an opening of an open housing part of the pulse inverter, wherein the protection device is configured to protect from dirt, mechanical impact and/or electrostatic charging, at least one inner element of the pulse inverter, in particular an electrical system and/or an electronic system, which is arranged in the open housing part. Optionally, the protection device is detachably arrangeable on an opening of an open housing part of the pulse inverter. Usually, the at least one inner element is at least one printed circuit board.

The housing is usually designed as an open housing part, wherein the opening of the open housing part can be sealable by the protection device. The protection device is thus designed as a protection device against electrostatic discharge (ESD) and dirt. The open housing part is usually made of aluminum.

The protection device is configured to protect the at least one inner element of the pulse inverter from external influences during assembly or disassembly.

Overall, the protection device offers the advantage that a pulse inverter can be provided in which, on the one hand, there are no unprotected electronics, and, on the other hand, aluminum can be saved, which, among other things, improves the $CO_2$ footprint.

In one embodiment, the protection device is configured to permanently remain on the open opening of the open housing part. This offers the advantage that a pulse inverter together with the protection device can be attached to an e-machine. In particular, a pulse inverter with the protection device can be attached to an e-machine housing, whereby the at least one inner element present in the pulse inverter, in particular a printed circuit board, is completely surrounded by the housing in the attached state.

In a further development, the protection device is configured to be adaptable to the opening of the open housing part. Optionally, the protection device is configured to be flexible so that the protection device can be adapted to an open housing opening during assembly if necessary.

In another further development, the protection device has at least one recess that is configured to be able to direct a protrusion of the at least one inner element through in the direction of the e-machine housing. For example, the at least one recess is configured to direct at least one power rail or low-inductance flat conductor connection through the recess to the e-machine, in particular an e-machine connection. In a further embodiment, the protection device is configured to seal at least one inner element against contamination, wherein the protection device is configured to leave out an e-machine connection.

In one further development, the protection device is designed as a pad or a shell. The pad or shell design offers the advantage that the protection device can be inserted or alternatively introduced into the open housing part. The protection device can be inserted into the open housing in such a way that a connection area of the open housing part is free. This means that the protection device is not an external element, for example a cover, which must be removed for mounting on an e-machine.

In one embodiment, the protection device is formed of a textile, a plastic grid and/or a dense plastic shell.

In one embodiment of the protection device as a pad, the pad is usually formed of a textile. The embodiment as a textile pad offers the advantage that the pad is easily and inexpensively produced and can be adapted to an opening of an open housing part. The embodiment of the pad made of a textile offers the advantage that the at least one inner element of the protection device can be protected from dirt.

Optionally, a textile pad may comprise a plastic grid. An embodiment of the textile pad comprising a plastic grid offers the advantage that a textile pad can be stabilized and reinforced by the plastic grid. Furthermore, an embodiment of the pad with a plastic grid offers the advantage that the at least one inner element of the pulse inverter can be protected from dirt and mechanical impact.

In an embodiment of the protection device as a shell, the shell is usually formed from a plastic grid or is formed as a dense plastic shell. The dense plastic shell generally has a thickness of between 0.5 mm and 3 mm, in particular between 1 mm and 2 mm. The design of the protection device as a dense plastic shell offers the advantage that the at least one inner element of the pulse inverter can be protected both from dirt and mechanical impact and from static charging.

In an embodiment, the protection device is designed as a dense plastic shell having a thickness of 1 mm.

Furthermore, some embodiments relate to a pulse inverter comprising a housing. The housing of the pulse inverter is typically formed of aluminum.

According to some embodiments, the housing is formed as an open housing part, wherein the open housing part is configured to be attachable to an e-machine housing, wherein the open housing part is configured to receive a protection device. The open housing part is thereby configured to receive the protection device on a protrusion. Usually, the protrusion is formed circumferentially on an inner wall of the open housing part.

Usually, the open housing has at least two connecting elements that are configured to attach the housing to the e-machine housing. Usually, a respective connecting element is formed in the connection area of the open housing. In a further embodiment, at least one connecting element is formed on an inner wall of the open housing or alternatively housing part. A respective connecting element is configured to engage or click into a connecting device formed on the e-machine housing.

In an embodiment, the open housing can thus be attached to the e-machine housing via at least one clip or click connection.

In a further embodiment, the open housing has at least two threaded through holes that are configured to receive a connecting element in the form of a screw, wherein the housing can be screwed to the e-machine housing by means of this screw connection.

In a further embodiment, the open housing part can be bonded or braced with the protection device on the e-machine housing.

In one embodiment, the open housing part is designed in such a way that the at least one inner element arranged in the open housing part is completely enclosed by the housings when attached to an e-machine housing. Thus, in the assembled state, the open housing part and the e-machine housing completely enclose the at least one inner element of the pulse inverter, in particular at least one printed circuit board.

In another further development, the open housing part comprises two opposite sides, each of which has at least one protrusion which is configured to receive the protection device. A respective protrusion is generally formed in the region of the opening of the housing part. Optionally, the protrusions have retaining elements that are configured to hold the protection device in position. For example, a retaining element is a hook-and-loop element or a bonding element. Optionally, at least one of the projections has at least one ground connection tooth. In one embodiment, at least one ground connection tooth is formed on at least one of the protrusions adjacent to the protection device. In a further embodiment, a respective protrusion is configured to receive the protection device, wherein the protection device has at least one integrally formed ground connection tooth. Generally, the protection device has a plurality of ground connection teeth circumferentially.

Furthermore, some embodiments relate to an e-machine with a pulse inverter as described above.

According to some embodiments, the pulse inverter comprises a protection device, wherein the pulse inverter comprises an open housing part configured to receive the protection device, wherein an e-machine housing of the E-machine is configured to receive the open housing part in which the protection device is arranged, wherein, in assembled state, the e-machine housing together with the open housing part are configured to completely enclose at least one inner element arranged in the open housing which is covered by the protection device.

Such an e-machine offers the advantage that, on the one hand, no open electronics are present during assembly or disassembly of the pulse inverter, and, on the other hand, aluminum can be saved, thereby improving the $CO_2$ footprint.

BRIEF DESCRIPTION OF THE SEVERAL VIEWS OF THE DRAWINGS

Embodiments of the invention are illustrated in the drawings and are further described with reference to the drawings, wherein the same components are identified by the same reference numbers.

FIG. 3a shows a top view of a further embodiment of the protection device.

FIG. 3b shows a detailed side view of the embodiment of the protection device shown in FIG. 3a.

FIG. 4a shows a top view of a further embodiment of the protection device.

FIG. 4b shows a detailed side view of the embodiment of the protection device shown in FIG. 4a.

DETAILED DESCRIPTION

Figure 1:
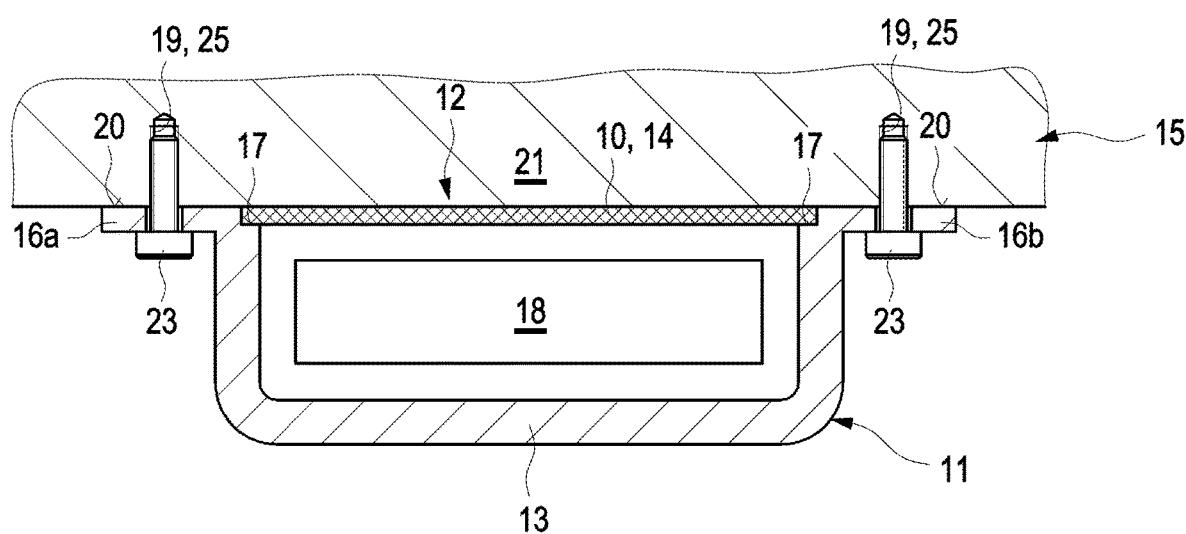
FIG. 1 shows a cross-section of an embodiment of a protection device.

FIG. 1 shows a cross-section of an embodiment of a protection device 10.

FIG. 1 shows an e-machine housing 15 of an e-machine. The e-machine housing 15 has at least two connecting devices 25, which are configured to receive a connecting element 23 formed on a pulse inverter 11.

In this embodiment, the e-machine housing 15 has connecting devices 25 in the form of two threads 19 which are configured to receive a connecting element 23 in the form of a screw. In a further embodiment, the at least two connecting devices 25 are receptacles for clip or click connecting elements.

A cross-section through a pulse inverter 11 is furthermore shown. The pulse inverter 11 thereby comprises an open housing part 13 and an inner element 18, which in this embodiment is a printed circuit board.

The pulse inverter 11 has an at least partially circumferential connection area 20, which is configured to be attachable to an outer wall 21 of the e-machine housing 15. The connection area 20 is optionally configured to receive a sealing element (that is not shown). The connection area 20 usually has at least two connecting elements 23 that are configured to be connectable to at least one of the connecting devices 25 of the e-machine housing 15.

In this embodiment, the application surface 20 has two through holes (not shown), which are each configured to receive a connecting element in the form of a screw, each of which is screwable into one of the threads 19 formed on the e-machine housing 15.

In this embodiment, the pulse inverter 11 further comprises the circumferential protrusion 17 which is configured to receive the protection device 10. The protrusion 17 is optionally at least partially formed circumferentially. Alternatively, the protrusion 17 is formed in sections. The protrusion 17 is usually formed on two opposite sides of the housing part 16a, 16b.

The protection device 10 can usually be placed on the protrusion 17. The protection device 10 is usually detachably attachable to the protrusion 17, wherein the protection device 10 is configured to be, for example, clickable, clipable or bondable to the protrusion 17.

The protection device 10 is designed as a pad 14 in this embodiment. The pad 14 is a mat that is formed, for example, from a textile. In a further embodiment, that is not shown, the protection device 10 is configured as a dense plastic shell, in particular a hard plastic shell. The protection device 10 is arranged to shield against dirt, dust, moisture or electrostatics, at least one printed circuit board 18, which is arranged in the open housing part 13 of the pulse inverter 11.

Figure 2:
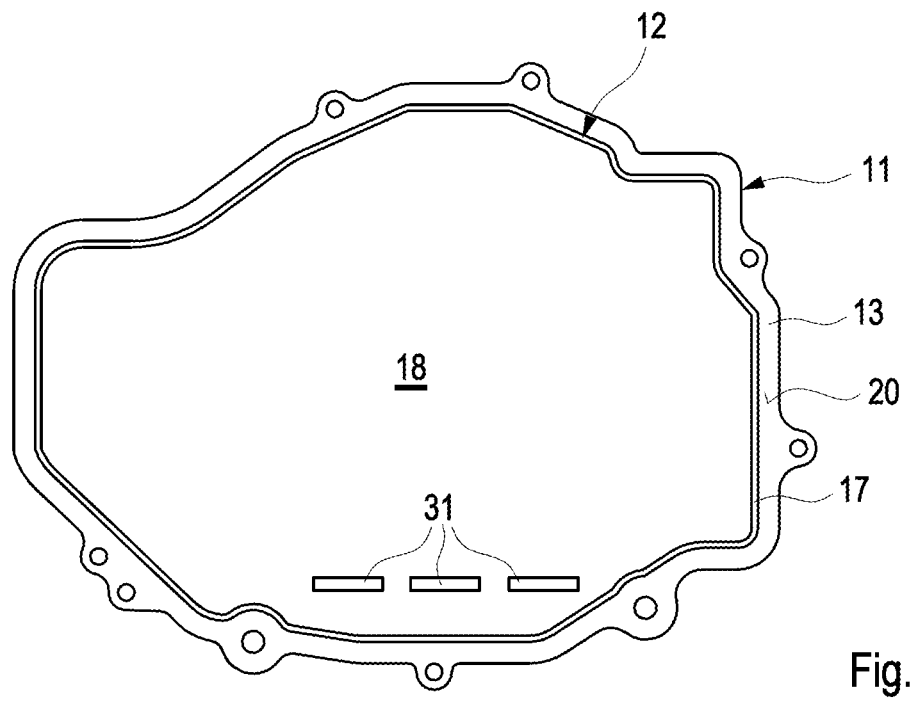
FIG. 2a shows a top view of an embodiment of a pulse inverter with an open housing part.
FIG. 2b shows a top view of an embodiment of a protection device.
Figure 2:
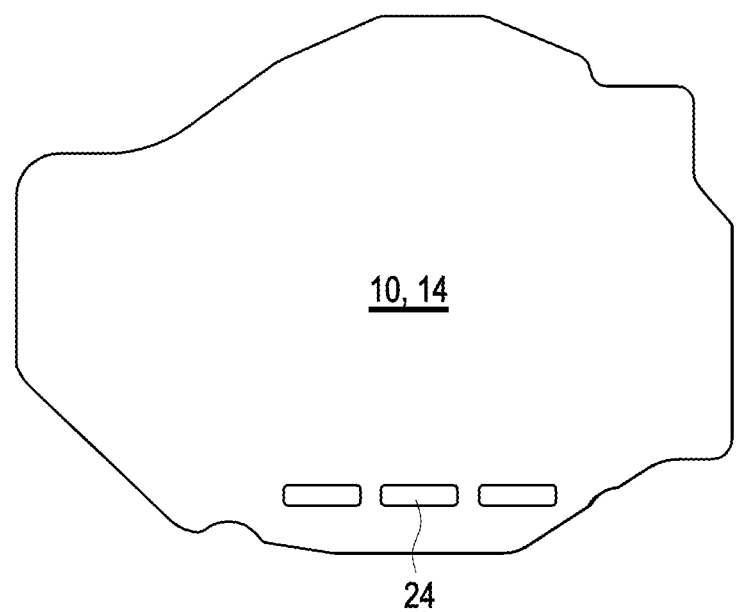

FIG. 2a shows a top view of an embodiment of a pulse inverter 11 having an open housing part 13. In FIG. 2a, the open housing part 13 of a pulse inverter 11 is shown, wherein the open housing part 13 has the circumferential connection area 20. The connection area 20 has a plurality of through holes 22 configured to receive a connecting element 23 in the form of a screw. Also shown is the circumferentially formed protrusion 17. The open housing 13 receives at least one inner element 18. Three power rails 31 are also shown.

FIG. 2b shows a top view of an embodiment of the protection device 10. In FIG. 2b, the protection device 10 is shown in the form of a pad 14, wherein the dirt protection pad or alternatively the protection device 10 being designed in accordance with a shape of at least one inner element (not shown) of a pulse inverter (not shown). The protection device 10 usually has at least one recess 24, which is configured to receive at least one of the power rails or alternatively flat conductors shown in FIG. 2a, or alternatively to pass it through the protection device 10.

Figure 3:
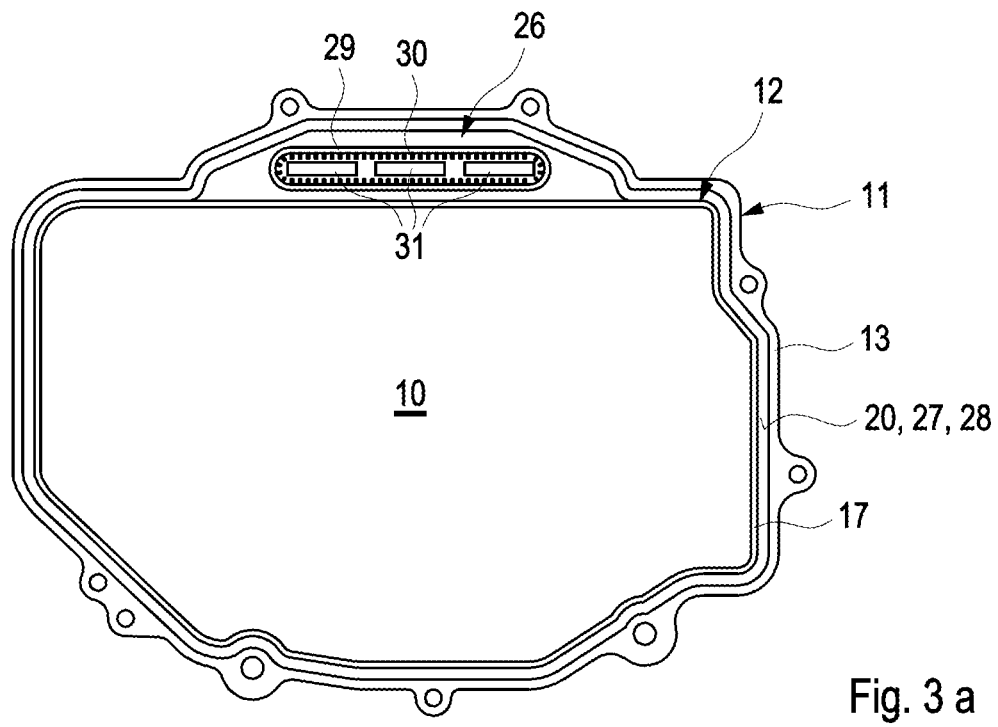
Figure 3:
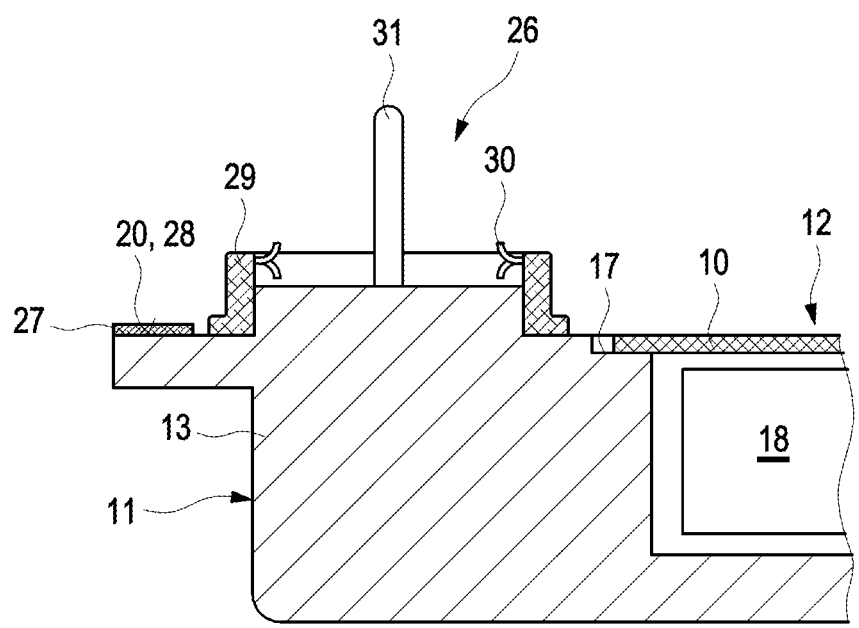

FIG. 3a shows a top view of a further embodiment of the protection device 10. Shown is an embodiment of the protection device 10 with a separate e-machine connection 26. The pulse inverter 11 is thereby shown with the open housing part 13, the opening 12 and the protrusion 17. The open housing part 13 has the connection area 20, which is configured as an outer sealing surface 28, wherein the sealing surface 28 has a circumferential seal 27.

The housing part 13 also has, in this embodiment, three power rails 31 extending from the inner element 18 of the pulse inverter 11 and forming the e-machine connection 26. In this embodiment, the power rails 31 in the assembled state are sealed in a watertight manner against the e-machine housing (not shown) by a circumferential sealing lip 29. The sealing lip 29 has a plurality of circumferential ground connection teeth 30, which are configured to establish an electrical contact between the e-machine housing (not shown) and the pulse inverter 11.

The protection device 10 is thereby arranged on the opening 12 of the open housing part 13 in such a way that the power rails 31 surrounded by the sealing lip 29 are not overlaid by the protection device 10. In this manner FIG. 3a shows a separate protection of at least one inner element (not shown) of the pulse inverter 11 and a separate sealing of the e-machine connection 26.

FIG. 3b shows a detailed view of a side view of the embodiment of the protection device 10 shown in FIG. 3a. The housing part 13 is shown, wherein the housing part 13 has the outer sealing surface 28, the connection area 20, and the protrusion 17. The outer sealing surface 28 is configured to receive the circumferential seal 27 and to seal the at least one inner element 18 of the pulse inverter 11 against moisture. The protrusion 17 is configured to receive the protection device 10. Also shown is one of the power rails 31 of the e-machine connection 26, wherein the power rail 31 is circumferentially surrounded by the sealing lip 29 with the plurality of ground connection teeth 30.

Figure 4:
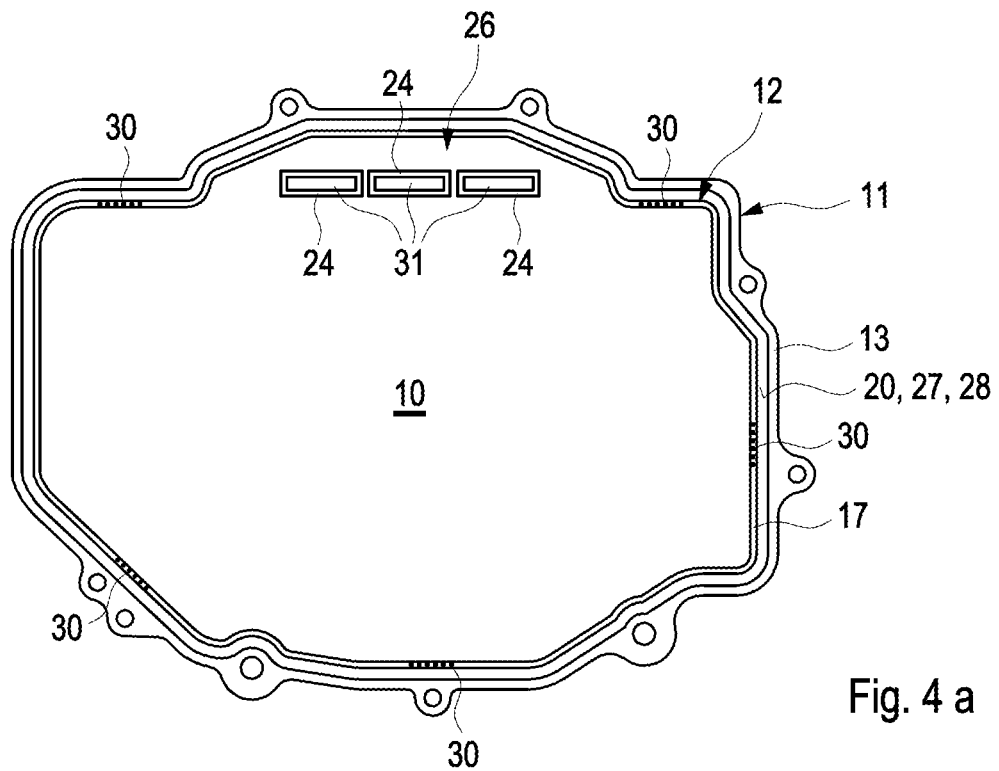
Figure 4:
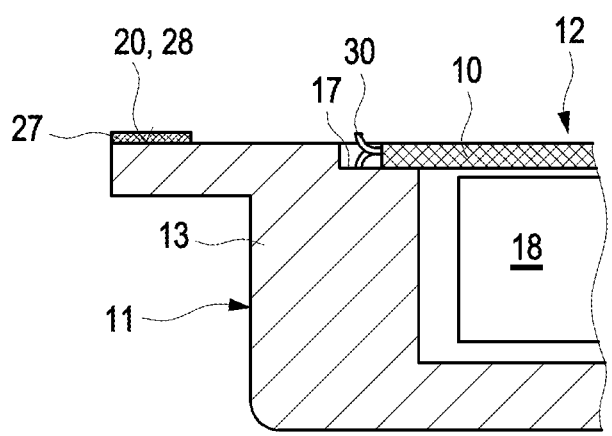

FIG. 4a shows a top view of a further embodiment of the protection device 10. In this, the pulse inverter 11 is shown with the open housing part 13, wherein furthermore the outer sealing surface 28, the connection area 20, is shown with the seal 27 as well as the protection device 10, which is formed to rest on the opening 12 by means of the at least one projection 17.

The protection device 10 has three recesses 24. The recesses 24 are each configured to have at least one power rail 31 directed through them. As a consequence, the protection device 10 is circumferentially formed around the power rails 31. In this, the protection device 10 is circumferentially formed around a respective power rail 31 of the e-machine connection 26. In addition, FIG. 4a shows that at least one ground connection tooth 30 is arranged in the region of the at least one protrusion 17 of the pulse inverter 11. The protection device 10 is arranged at a distance from the connection area 20 of the pulse inverter 11 on the opening 12 of the pulse inverter 11, such that the at least one ground connection tooth 30 can extend between the protection device 10 and the connection area 20.

FIG. 4b shows a detailed view of a side view of the embodiment of the protection device 10 shown in FIG. 4a. The housing part 13 of the pulse inverter 11 is thereby shown, wherein the housing part 13 has the outer sealing surface 28, the connection area 20, with the circumferential seal 27. Furthermore, the protrusion 17 is shown, which is configured to receive the protection device 10. The outer sealing surface 28 is configured to seal the pulse inverter 11 against the e-machine housing (not shown). Also shown is that the protrusion 17 receives at least one ground connection tooth 30. Usually, the at least one ground connection tooth 30 is arranged adjacent to the protection device 10 on the protrusion 17. In an embodiment, the at least one ground connection tooth 30 is molded onto the protection device 10. In this case, the at least one ground connection tooth 30 can already be integrated into the protection device 10 during a manufacturing process of the protection device 10. In particular, the ground connection teeth 30 are generally designed to be integrated in the protection device 10 in such a way that a respective tooth neck of a respective ground connection tooth 30 is at least partially enclosed or alternatively extrusion coated by the protection device 10, wherein the ground connection teeth 30 is designed to be free of protection devices in regions of a ground connection.

German patent application no. 10 2020 129134.5, filed Nov. 5, 2020, to which this application claims priority, is hereby incorporated herein by reference, in its entirety.

Aspects of the various embodiments described above can be combined to provide further embodiments. In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. A system, comprising:
an electric machine housing;
a pulse inverter having an open housing part, at least one inner element arranged in the open housing part, and at least one power rail extending from the at least one inner element toward an opening of the open housing part;
a protection device between an outer wall of the electric machine housing and the at least one inner element;
wherein the protection device is on the opening of the open housing part of the pulse inverter;
wherein the protection device is configured to protect the at least one inner element of the pulse inverter from dirt, mechanical impact or electrostatic charging;
wherein the at least one power rail is sealed in a watertight manner against the electric machine housing by a circumferential sealing lip; and
wherein the protection device is arranged on the opening of the open housing part such that the at least one power rail surrounded by the circumferential sealing lip is not overlaid by the protection device.

2. The system of claim 1, wherein the protection device is configured to remain permanently on the open opening of the open housing part.

3. The system of claim 1, wherein the protection device is configured to be adaptable to the opening of the open housing part.

4. The system of claim 1, wherein the protection device comprises at least one recess, and wherein the at least one power rail extends through the at least one recess toward the electric machine housing.

5. The system of claim 1, wherein the protection device is designed as a pad or as a shell.

6. The system of claim 1, wherein the protection device is formed of a textile, a plastic grid, or a dense plastic shell.

7. The system of claim 1, wherein the at least one inner element of the pulse inverter is an electrical system or an electronic system.

8. The system of claim 1, wherein the circumferential sealing lip has a plurality of circumferential connection teeth that establish electrical contact between the electric machine housing and the pulse inverter.

9. A pulse inverter, comprising:
a housing formed with an open housing part;
at least one inner element arranged in the housing;
at least one power rail extending from the at least one inner element toward an opening of the open housing part;
wherein the open housing part is configured to be attachable to an electric machine housing; and
wherein the open housing part is configured to receive a protection device;
wherein the at least one power rail is configured to be sealed in a watertight manner against the electric machine housing by a circumferential sealing lip; and
wherein the protection device is arranged on the opening of the open housing part such that the at least one power rail surrounded by the circumferential sealing lip is not overlaid by the protection device.

10. The pulse inverter according to claim 9, wherein the open housing part is configured such that the at least one inner element is completely enclosed by the open housing part of the pulse inverter and the electric machine housing when the open housing part of the pulse inverter is attached to the electric machine housing.

11. The pulse inverter according to claim 9, wherein the open housing part comprises two opposite sides each having at least one protrusion which is configured to receive the protection device.

12. The pulse inverter of claim 9, wherein the circumferential sealing lip has a plurality of circumferential connection teeth that establish electrical contact between the electric machine housing and the pulse inverter.

13. An electric machine, comprising:
an electric machine housing;
a pulse inverter including a protection device, an open housing part, and at least one inner element arranged in the open housing part, the open housing part configured to be attachable to the electric machine housing and to receive the protection device; and
at least one power rail extending from the at least one inner element toward an opening of the open housing part;
wherein the electric machine housing is configured to receive the open housing part in which the protection device is arranged; and
wherein, in an assembled state, the electric machine housing together with the open housing part are configured to completely enclose the at least one inner element arranged in the open housing part which is covered by the protection device;
wherein the at least one power rail is sealed in a watertight manner against the electric machine housing by a circumferential sealing lip; and
wherein the protection device is arranged on the opening of the open housing part such that the at least one power rail surrounded by the circumferential sealing lip is not overlaid by the protection device.

14. The electric machine of claim 13, wherein the circumferential sealing lip has a plurality of circumferential connection teeth that establish electrical contact between the electric machine housing and the pulse inverter.

* * * * *

UNITED STATES PATENT AND TRADEMARK OFFICE
CERTIFICATE OF CORRECTION

PATENT NO. : 11,791,742 B2
APPLICATION NO. : 17/453276
DATED : October 17, 2023
INVENTOR(S) : Tobias Enzinger et al.

Page 1 of 1

It is certified that error appears in the above-identified patent and that said Letters Patent is hereby corrected as shown below:

In the Claims

Column 7, Claim 2, Line 41:
"permanently on the open opening of" should read: --permanently on the opening of--.

Signed and Sealed this
Twenty-fifth Day of March, 2025

Coke Morgan Stewart
*Acting Director of the United States Patent and Trademark Office*